United States Patent
Kirsch et al.

(10) Patent No.: US 8,706,278 B2
(45) Date of Patent: Apr. 22, 2014

(54) NON-BUSSED VEHICLE AMPLIFIER DIAGNOSTICS

(75) Inventors: Matthew R. Kirsch, Shelby Township, MI (US); Richard A. Close, Farmington Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 7 days.

(21) Appl. No.: 13/397,192

(22) Filed: Feb. 15, 2012

(65) Prior Publication Data

US 2013/0211663 A1 Aug. 15, 2013

(51) Int. Cl.
*G06F 17/00* (2006.01)

(52) U.S. Cl.
USPC ........ 700/94; 700/26; 700/81; 300/2; 381/28; 381/86

(58) Field of Classification Search
USPC .................. 700/26, 81, 94; 330/2; 381/28, 86
See application file for complete search history.

(56) References Cited

U.S. PATENT DOCUMENTS

| | | | | |
|---|---|---|---|---|
| 4,792,751 | A * | 12/1988 | Blumenkranz et al. | 324/620 |
| 5,450,624 | A * | 9/1995 | Porambo et al. | 455/226.4 |
| 5,790,481 | A * | 8/1998 | Meitner | 369/2 |
| 6,542,069 | B1 * | 4/2003 | Rathgeber | 340/5.3 |
| 6,778,934 | B1 * | 8/2004 | Hori et al. | 702/119 |
| 2002/0071568 | A1 * | 6/2002 | Shuttleworth | 381/58 |
| 2004/0112124 | A1 * | 6/2004 | Sonnenrein et al. | 73/118.1 |
| 2004/0260416 | A1 * | 12/2004 | Kellom et al. | 700/94 |
| 2005/0195984 | A1 * | 9/2005 | Miura et al. | 381/63 |
| 2005/0232437 | A1 * | 10/2005 | Albus et al. | 381/86 |
| 2008/0214101 | A1 * | 9/2008 | Voto | 455/3.02 |
| 2008/0297336 | A1 * | 12/2008 | Lee | 340/439 |
| 2009/0034745 | A1 * | 2/2009 | Mizuno | 381/1 |
| 2012/0286798 | A1 * | 11/2012 | Matsuyama et al. | 324/538 |
| 2013/0145460 | A1 * | 6/2013 | Dudley et al. | 726/21 |

FOREIGN PATENT DOCUMENTS

| | | | | |
|---|---|---|---|---|
| EP | 0027078 A1 * | 10/1980 | | G01R 31/28 |
| JP | 03-283800 | * 12/1991 | | H04R 29/00 |

OTHER PUBLICATIONS

English Machine Language Translation of JP Publication No. 03-283800, published Dec. 13, 1991. Retrieved from http://www19.ipdl.inpit.go.jp/PA1/result/detail/main/weVEgyaDA403283800P1.htm.*

* cited by examiner

*Primary Examiner* — Calvin Cheung
(74) *Attorney, Agent, or Firm* — Cantor Colburn LLP

(57) ABSTRACT

Non-bussed amplifier diagnostics are implemented for a vehicle. The vehicle includes an amplifier that includes a computer processor and a memory unit communicatively coupled to the amplifier. The memory unit stores audio test tones, each of which corresponds to a respective diagnostic test result. The vehicle also includes an input device communicatively coupled to the amplifier via wiring. The input device provides an analog signal indicative of a diagnostic test trigger to the amplifier. The computer processor of the amplifier receives the analog signal and executes a diagnostic test defined by the diagnostic test trigger, selects one of the audio test tones based on results of the diagnostic test, and outputs the selected audio test tone via speakers of the vehicle.

20 Claims, 2 Drawing Sheets

NON-BUSSED VEHICLE AMPLIFIER DIAGNOSTICS

FIELD OF THE INVENTION

The subject invention relates to vehicle diagnostics, more particularly, to diagnostics for a non-bussed vehicle amplifier.

BACKGROUND

Many audio amplifiers in vehicles do not use serial data communications due to limitations associated with the vehicle architecture, costs associated with these communications, and other constraints. As such, diagnostic testing using the vehicle's serial data bus is not possible at the assembly plant or while the vehicle is in service, thereby rendering the amplifiers vulnerable to undetected operational issues. One method of testing non-bussed vehicle amplifiers involves disconnecting portions thereof, such as removal of trim panels and disconnection of some of the wiring, which can be invasive and time consuming.

Accordingly, it is desirable to provide a way to perform diagnostic testing on non-bussed vehicle amplifiers, both at the assembly plant and during servicing of the vehicle.

SUMMARY OF THE INVENTION

In one exemplary embodiment of the invention, a method for implementing non-bussed amplifier diagnostics for a vehicle is provided. The method includes transmitting, via an input device, an analog signal indicative of a diagnostic test trigger. The method also includes receiving, at a computer processor of an amplifier disposed in the vehicle, the analog signal indicative of a diagnostic test trigger, the amplifier communicatively coupled to the input device via wiring. The method also includes executing, by the computer processor, a diagnostic test defined by the diagnostic test trigger, selecting an audio test tone based on results of the diagnostic test, and transmitting the audio test tone to speakers communicatively coupled to the amplifier. The audio test tone is one of a number of audio test tones stored in a memory unit coupled to the amplifier. The method further includes outputting the audio test tone via the speakers.

In another exemplary embodiment of the invention, a system for implementing non-bussed amplifier diagnostics for a vehicle is provided. The system includes an amplifier that includes a computer processor and a memory unit communicatively coupled to the amplifier. The memory unit stores audio test tones, each of which corresponds to a respective diagnostic test result. The vehicle also includes an input device communicatively coupled to the amplifier via wiring. The input device provides an analog signal indicative of a diagnostic test trigger to the amplifier. The computer processor of the amplifier receives the analog signal and executes a diagnostic test defined by the diagnostic test trigger, selects one of the audio test tones based on results of the diagnostic test, and outputs the selected audio test tone via speakers of the vehicle.

In yet another exemplary embodiment of the invention a computer program product for implementing non-bussed amplifier diagnostics for a vehicle is provided. The computer program product includes a computer-readable storage medium having instructions embodied thereon, which when executed by a computer, cause the computer to implement a method. The method includes receiving, from an input device, an analog signal indicative of a diagnostic test trigger. The input device is communicatively coupled to the computer of an amplifier in the vehicle via wiring. The method also includes executing a diagnostic test defined by the diagnostic test trigger, selecting an audio test tone based on results of the diagnostic test, and transmitting the audio test tone to speakers communicatively coupled to the amplifier. The audio test tone is one of a number of audio test tones stored in a memory unit coupled to the amplifier. The method also includes outputting the audio test tone via the speakers.

The above features and advantages and other features and advantages of the invention are readily apparent from the following detailed description of the invention when taken in connection with the accompanying drawings.

BRIEF DESCRIPTION OF THE DRAWINGS

Other features, advantages and details appear, by way of example only, in the following detailed description of embodiments, the detailed description referring to the drawings in which.

DESCRIPTION OF THE EMBODIMENTS

Figure 1:
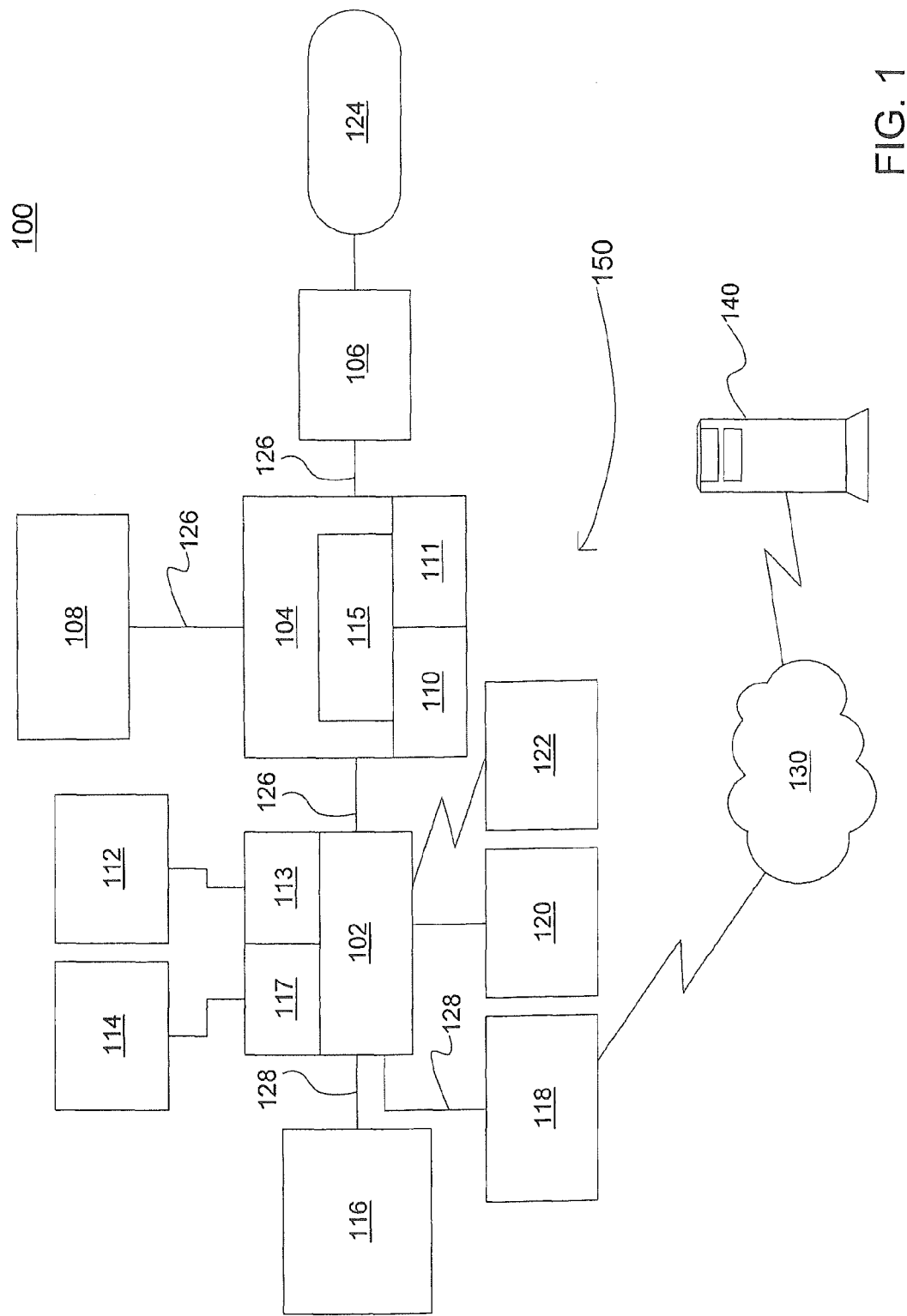
FIG. 1 is a system upon which non-bussed amplifier diagnostics may be implemented in accordance with an exemplary embodiment of the invention.

The following description is merely exemplary in nature and is not intended to limit the present disclosure, its application or uses. It should be understood that throughout the drawings, corresponding reference numerals indicate like or corresponding parts and features.

In accordance with an exemplary embodiment of the invention, non-bussed amplifier diagnostics (also referred to herein as "amplifier diagnostics") is provided. The amplifier diagnostics enables testing of non-bussed vehicle amplifiers using a predetermined trigger input signal from an input device of the vehicle, which may be a radio or microphones connected to the amplifier. The amplifier then uses the vehicle's speakers to play back a series of tones to report the results of the testing. The non-bussed amplifier diagnostics allows for faster, less invasive and lower cost troubleshooting of audio system failures with the amplifier and speakers that result in less time the vehicle is spent in service, fewer unnecessary amplifier or speaker replacements, and a less invasive method to troubleshoot the audio system (e.g., fewer components replaced, fewer trim panels removed, fewer wire connectors disconnected/reconnected, etc.). These and other features of the non-bussed amplifier diagnostics will now be described.

Turning now to FIG. 1, a system 100 upon which the non-bussed amplifier diagnostics may be implemented will now be described in an exemplary embodiment. The system 100 includes components of a vehicle 150, some of which form part of an infotainment system. The infotainment system may include a variety of components that are not specifically shown in FIG. 1 but will be understood by those skilled in the art (e.g., deck, tuner, digital signal processing unit) as being elements of a vehicle infotainment system. As shown in FIG. 1, the infotainment system is in communication with a host system 140 over one or more networks 130 via a telematics system 118 of the vehicle 150. The telematics system 118 provides one means of initiating the exemplary amplifier diagnostics testing and/or results reporting. As described herein, various different techniques may be used in lieu of the telematics system 118 in order to realize the advantages of the exemplary embodiments.

Components of the vehicle 150 include a radio 102 coupled to an amplifier 104 via wiring 126. The wiring 126 transmits analog signals from the radio 102 to the amplifier 104. The amplifier 104, in turn, is coupled to speakers 106 via wiring 126. The amplifier 104 forms part of a device that includes a computer processing unit (CPU) 110 and logic 111, which are configured as hardware elements (e.g., circuitry, logic cores, registers, etc.) and software elements, respectively, for processing data configured to implement the exemplary non-bussed amplifier diagnostics described herein. The amplifier 104 also includes memory 115. The memory 115 stores a number of diagnostic test tones (also referred to herein as "audio test tones"). Each of the diagnostic test tones corresponds with a particular test result. The diagnostic test tones may be differentiated according to frequency, period, and/or patterns. The test results are indicative of the operational condition or status of various elements of the infotainment system subject to diagnostic testing. For example, diagnostic testing can be performed to test connections between the amplifier 104 and the speakers 106. Other non-limiting examples of diagnostic testing may include assessing input connections from the radio 102, output connections to the speakers 106, internal amplifier faults (e.g., hardware or software faults, over temperature, etc.), other connections to the vehicle, such as power and ground (e.g., the amplifier 104 may detect low or high input voltage).

The amplifier 104 is also communicatively coupled to one or more microphones 108 via wiring 126. In an exemplary embodiment, the speakers 106 are configured to output results of diagnostic testing, and these results are generally shown in FIG. 1 as 124.

The wiring 126 may be any type of electrical coupling known in the art, e.g., a discrete wire, twisted pair, or twisted and shielded pair wiring that enables analog signal communication.

The radio 102 is communicatively coupled to a serial data bus 128 on the vehicle 150. The serial data bus 128 may be any type of electrical coupling known in the art, such as a discrete wire, twisted pair, or twisted and shielded pair wiring that enables digital serial data communications. As shown in FIG. 1, an interface component 116 allows vehicle components, such as a service or programming tool (not shown) to connect to the serial data bus 128. In an embodiment, the interface component 116 is an assembly line diagnostic link (ALDL). The interface component 116 provides an alternative method of initiating the exemplary amplifier diagnostics by allowing a service technician to communicate with the radio 102 over the serial data bus 128, as will be described further herein.

The telematics system 118 is communicatively coupled to the radio 102 via a serial data bus 128. The telematics system 118 provides communications-based services such as emergency warning systems, global positioning system navigation, hands-free cellular communications, and driving assistance information. An example of a telematics system is OnStar®. In an embodiment, the telematics system 118 is configured to receive logic configured to perform the exemplary non-bussed amplifier diagnostics, and to relay this logic to the amplifier 104, as will be described further herein.

The radio 102 includes various radio control buttons 120, such as a volume control, station selection control, power control, and may also include a hidden button selection (e.g., a pre-defined sequence of buttons 120) configured for initiating diagnostic testing, as will be described herein. The radio is coupled to, or integrated with, storage drives for receiving removable memory devices. As shown in FIG. 1, the radio is coupled to a storage drive 117 that enables a vehicle operator to insert a USB memory stick 114 or other memory device into the drive 117 and receive data stored on the memory stick 114. In one embodiment, the memory stick 114 stores one or more diagnostic test triggers.

The radio 102 is further coupled, or integrated with, a CD/DVD drive 113 that enables a vehicle operator to insert a CD or DVD device 112 into the CD/DVD drive 113 for playing media, such as music, movies, or audio on the infotainment system, or for receiving data stored on the CD. In one embodiment, the CD/DVD device 112 stores one or more diagnostic test triggers.

The radio 102 is also configured to communicatively couple with a wireless device 122, which may be a smart phone or other wireless, low frequency wave-enabled device. For example, the wireless device 122 may be enabled using Bluetooth™ technology. In another embodiment, the wireless device 122 may be a music player (e.g., MP3 player) that communicates with the radio via frequency modulated signals. The wireless device 122 may store one or more diagnostic test triggers.

The host system 140 may be implemented by a host provider of the exemplary non-bussed amplifier diagnostics. For example, the host system 140 may be implemented by a vehicle manufacturer or dealership. The host system 140 may be implemented as a high-speed computer processing device (e.g., a mainframe computer) capable of handling a high volume of activities conducted between the host system 140 and other network entities (e.g., the telematics system 118, wireless device 122, and any computer system having network access capabilities). The host system 140 may include an application server for electronically providing an application configured for performing the exemplary amplifier diagnostics described herein.

The networks 130 may be any type of known networks in the art. For example, the networks 130 may be a combination of public (e.g., Internet), private (e.g., local area network, wide area network, virtual private network), and may include wireless and wireline transmission systems (e.g., satellite, cellular network, terrestrial networks, etc.).

The exemplary amplifier diagnostics may be initiated in a variety of different ways. In one embodiment, the logic 111 including instructions for performing the amplifier diagnostics is stored in a memory location (e.g., memory 115) of the amplifier 104. The CPU 110 executes the logic 111 upon the occurrence of a triggering event.

In one embodiment, a vehicle service provider who is servicing the vehicle 150 may access the host system 140 to download an application for implementing the amplifier diagnostics described herein. For example, the vehicle service provider may download the application and store it on a CD 112, which is then inserted into the CD/DVD drive 113 coupled to the radio 102. The diagnostics testing is then initiated using one of the techniques described herein. Alternatively, the vehicle owner may download the application to wireless device 122, which initiates the diagnostic testing through communications with the radio 102 over a wireless connection (e.g., Bluetooth™).

Figure 2:
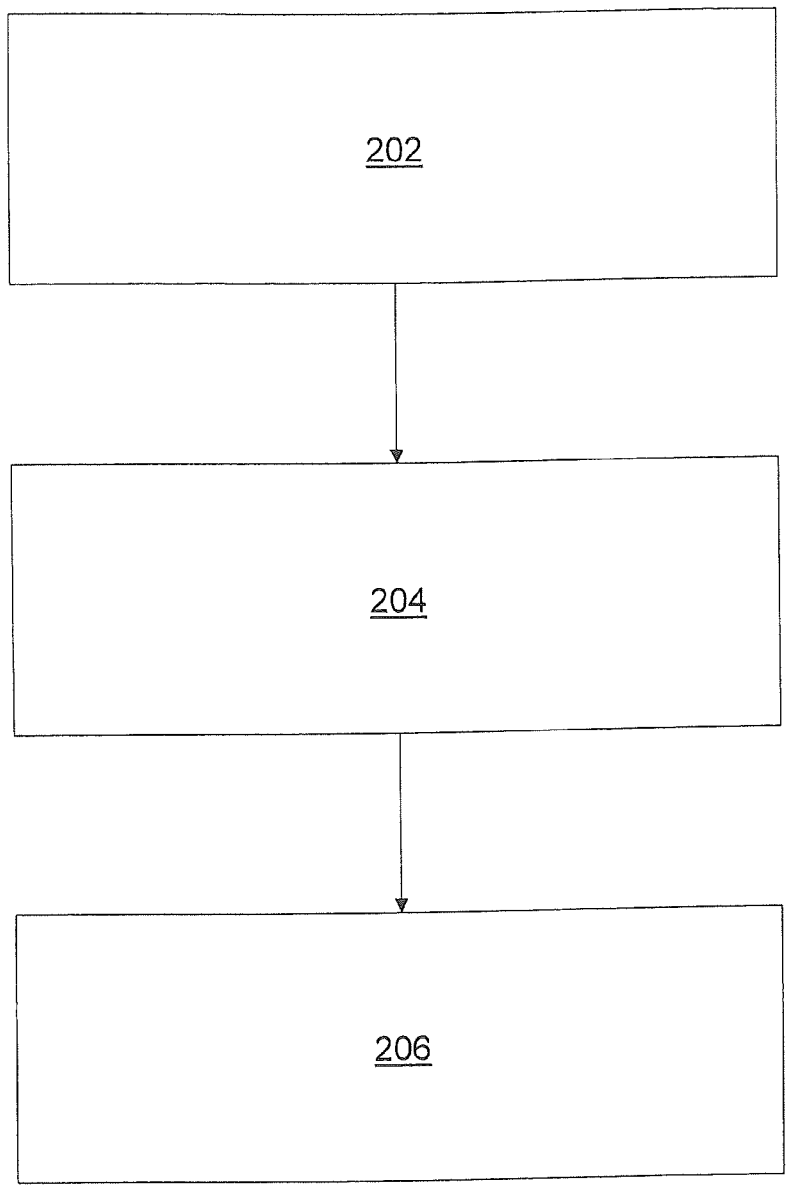
FIG. 2 is a flow diagram describing a process for performing non-bussed amplifier diagnostics in accordance with an exemplary embodiment.

Turning now to FIG. 2, a process for implementing non-bussed amplifier diagnostics will now be described in an exemplary embodiment.

At step 202, the amplifier 104 receives an analog signal from one of the radio 102 or the microphone 108. The analog signal is indicative of a predetermined diagnostic test trigger that uniquely identifies a particular diagnostic test. For example, one such diagnostic test trigger may cause the amplifier 104 to test and report out any current diagnostic faults such as a shorted audio output to a speaker 106 or an internal fault in the amplifier software. Another diagnostic test trigger may cause the amplifier 104 to test and report out any diagnostic faults stored in history (e.g., faults that were present at one time but are no longer present), such as a low input voltage or open audio input connection from the radio 102. This may be useful in diagnosing intermittent faults. The trigger event may be initiated a variety of different ways.

For example, the radio controls 120 may be configured such that selection of a pre-defined sequence of the controls 120 causes a diagnostic test trigger to initiate a diagnostic test.

In another example, the trigger event may be initiated by inserting one of the USB memory stick 114, CD or DVD 112 into a respective storage drive 117 or 113, and a diagnostic test trigger stored thereon may be communicated via the radio 102 to the amplifier 104. In one embodiment, a service technician may download the test triggers from the host system 140 and store the test triggers on a CD or DVD 112, or memory stick 114. In a further example, the trigger event may be initiated using the interface component 116 and the serial data bus 128. A service technician sends commands to the radio 102 over the serial data bus 128 via the interface component 116 (e.g., ALDL), which in turn, processes the digital serial data, generates an analog signal (i.e., indicative of the audio test tones), and sends audio test tones to the amplifier 104 to initiate diagnostics. Thus, the radio 102 uses the digital serial data as a command or triggering event. The radio 102 may include hardware and/or software to interpret the digital serial data and produce an analog signal. The amplifier 104 then converts the analog signal into a digital signal to be processed by the amplifier's logic 111.

In yet a further example, the trigger event may be initiated using a wireless device (e.g., wireless device 122) that transmits a diagnostic test trigger to the radio 102 over a wireless network. In an alternative embodiment, the trigger event may be initiated by transmitting the diagnostic test trigger from the host system 140 over networks 130 to the telematics system 118, which in turn transmits the test trigger over the serial data bus 128 to the radio 102 and to the amplifier 104.

Finally, the trigger event may be initiated by using an audio tone that corresponds to a particular diagnostic test, which is received by the microphone 108 and transmitted to the amplifier 104.

At step 204, the logic 111 executes a diagnostic test corresponding to the test trigger. The diagnostic tests that may be performed include detecting faults with input connections from the radio 102, detecting faults with output connections to the speakers 106, detecting internal amplifier faults (e.g., hardware or software faults, over temperature, etc.), and detecting faults with other connections to the vehicle 150, such as power and ground (e.g., the amplifier 104 could detect low or high input voltage, etc.).

At step 206, the logic 111 of the amplifier 104 generates a report 124 that includes the results of the testing. As indicated above, multiple tests may be performed where each test corresponds to a unique test trigger. In addition, each test result corresponds to a predefined diagnostic test tone. The logic 111 matches the test result to a corresponding diagnostic test tone and outputs the diagnostic test tone via the speakers 106.

Technical effects include diagnostic testing of non-bussed vehicle amplifiers. The testing uses a predetermined trigger input signal from the vehicle's radio or predetermined tones received by the microphones connected to the amplifier. The amplifier then uses the vehicle's speakers to play back a series of tones to report the results of the testing. The non-bussed amplifier diagnostics allows for faster, less invasive and lower cost troubleshooting of audio system failures with the amplifier and speakers that result in less time the vehicle is spent in service, fewer unnecessary amplifier or speaker replacements, and a less invasive method to troubleshoot the audio system (e.g., fewer components replaced, fewer trim panels removed, fewer wire connectors disconnected/reconnected, etc.).

As described above, the invention may be embodied in the form of computer implemented processes and apparatuses for practicing those processes. Embodiments of the invention may also be embodied in the form of computer program code containing instructions embodied in tangible media, such as floppy diskettes, CD-ROMs, hard drives, or any other computer readable storage medium, wherein, when the computer program code is loaded into and executed by a computer, the computer becomes an apparatus for practicing the invention. An embodiment of the invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed, but that the invention will include all embodiments falling within the scope of the application.

What is claimed is:

1. A system for implementing a diagnostic test for a non-bussed amplifier of a vehicle, the system comprising:
a computer processor integrated with the non-bussed amplifier, the non-bussed amplifier lacking a physical connection to a serial data bus of the vehicle;
a memory unit communicatively coupled to the non-bussed amplifier, the memory unit storing a plurality of audio test tones, each of the audio test tones corresponding to a respective diagnostic test result; and
an input device communicatively coupled to the non-bussed amplifier, the input device providing an analog signal indicative of a diagnostic test trigger to the non-bussed amplifier, the diagnostic test trigger configured to initiate the diagnostic test;
wherein the computer processor performs the diagnostic test, the diagnostic test configured to:
receive the analog signal and execute the diagnostic test defined by the diagnostic test trigger;
select one of the audio test tones based on results of the diagnostic test; and
output the one of the audio test tones to speakers of the vehicle.

2. The system of claim 1, wherein the input device includes a radio, and the system further comprises a pre-defined combination of buttons communicatively coupled to the radio, the pre-defined combination of buttons are configured, upon selection, to execute the diagnostic test trigger.

3. The system of claim 1, wherein the input device includes a radio, and the system further comprises a storage drive communicatively coupled to the radio, the storage drive configured to receive a removable memory device that stores the diagnostic test trigger;
  wherein when the removable memory device is inserted into the storage drive, the diagnostic test trigger is transmitted from the radio to the computer processor of the non-bussed amplifier.

4. The system of claim 1, wherein the input device includes a radio, and the system further comprises a telematics system, the radio communicatively coupled to the telematics system;
  wherein the telematics system transmits a digital serial data signal indicative of the diagnostic test trigger to the radio, and the radio generates the analog signal from the digital serial data signal.

5. The system of claim 1, wherein the input device includes a radio, and the system further comprises a wireless communication device, the wireless communication device configured to transmit a request to initiate the diagnostic test to the non-bussed amplifier via the radio over a wireless network.

6. The system of claim 1, wherein the input device includes a microphone, and the diagnostic test trigger is a preconfigured unique audio tone;
  wherein when the microphone receives the preconfigured unique audio tone, the microphone transmits the preconfigured unique audio tone to the non-bussed amplifier.

7. The system of claim 1, wherein the audio test tones are differentiated by at least one of frequency, period, and pattern.

8. A method for implementing a diagnostic test for a non-bussed amplifier of a vehicle, the method comprising:
  transmitting, via an input device in the vehicle, an analog signal indicative of a diagnostic test trigger, the diagnostic trigger configured to initiate the diagnostic test;
  receiving the analog signal, at a computer processor integrated with the non-bussed amplifier disposed in the vehicle, the non-bussed amplifier communicatively coupled to the input device, the non-bussed amplifier lacking a physical connection to a serial data bus of the vehicle;
  executing, by the computer processor, the diagnostic test defined by the diagnostic test trigger;
  selecting, by the computer processor, an audio test tone based on results of the diagnostic test; and
  transmitting the audio test tone to speakers communicatively coupled to the non-bussed amplifier, the audio test tone being one of a plurality of audio test tones stored in a memory unit coupled to the non-bussed amplifier, wherein the audio test tone is output by the speakers.

9. The method of claim 8, wherein the input device includes a radio, the method further comprising:
  receiving, at the radio, the diagnostic test trigger via a selection of a pre-defined combination of buttons communicatively coupled to the radio.

10. The method of claim 8, wherein the input device includes a radio, the method further comprising:
  receiving, at a storage drive communicatively coupled to the radio, a removable memory device that stores the diagnostic test trigger.

11. The method of claim 8, wherein the input device includes a radio, the method further comprising:
  receiving, at the radio, the diagnostic test trigger from a telematics system that is communicatively coupled to the radio; and
  generating, via the radio, the analog signal from a digital serial data signal indicative of the diagnostic test trigger.

12. The method of claim 8, wherein the input device includes a radio, the method further comprising:
  receiving, at the radio, the diagnostic test trigger from a wireless communication device that is wirelessly coupled to the radio.

13. The system of claim 8, wherein the input device includes a microphone and the diagnostic test trigger is a preconfigured unique audio tone, the method further comprising:
  transmitting, by the microphone, the preconfigured unique audio tone to the non-bussed amplifier.

14. The method of claim 8, wherein the audio test tones are differentiated by at least one of frequency, period, and pattern.

15. A computer program product implementing a diagnostic test for a non-bussed amplifier of a vehicle, the computer program product comprising a non-transitory computer-readable storage medium encoded with instructions, which when executed by a computer cause the computer to implement:
  receiving, from an input device, an analog signal indicative of a diagnostic test trigger, the diagnostic test trigger configured to initiate the diagnostic test, the input device communicatively coupled to the computer of an amplifier in the vehicle via wiring;
  executing a diagnostic test defined by the diagnostic test trigger;
  selecting an audio test tone based on results of the diagnostic test and transmitting the audio test tone to speakers communicatively coupled to the amplifier, the audio test tone being one of a plurality of audio test tones stored in a memory unit coupled to the amplifier; and
  outputting the audio test tone via the speakers.

16. The computer program product of claim 15, wherein the input device includes a radio, the instructions further causing the computer to implement:
  receiving, from the radio, the diagnostic test trigger via a selection of a pre-defined combination of buttons communicatively coupled to the radio.

17. The computer program product of claim 15, wherein the input device includes a radio, the instructions further causing the computer to implement:
  receiving the diagnostic test trigger from a removable memory device that is communicatively coupled to the radio, the diagnostic test trigger stored on the removable memory device.

18. The computer program product of claim 15, wherein the input device includes a radio, the instructions further causing the computer to implement:
  receiving, from the radio, the diagnostic test trigger via a telematics system that is communicatively coupled to the radio.

19. The computer program product of claim 15, wherein the input device includes a radio, the instructions further causing the computer to implement:
  receiving, at the radio, the diagnostic test trigger from a wireless communication device that is wirelessly coupled to the radio.

20. The computer program product of claim 15, wherein the input device includes a microphone and the diagnostic test trigger is a preconfigured unique audio tone, the instructions further causing the computer to implement:
  receiving the preconfigured unique audio tone from the microphone.

* * * * *